(12) United States Patent
Milkov et al.

(10) Patent No.: US 9,479,116 B2
(45) Date of Patent: Oct. 25, 2016

(54) CAPACITIVE TRANS-IMPEDANCE AMPLIFIER CIRCUIT WITH CHARGE INJECTION COMPENSATION

(71) Applicant: Teledyne Scientific & Imaging, LLC, Thousand Oaks, CA (US)

(72) Inventors: Mihail M. Milkov, Moorpark, CA (US); David J. Gulbransen, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 259 days.

(21) Appl. No.: 14/671,930

(22) Filed: Mar. 27, 2015

(65) Prior Publication Data

US 2016/0285419 A1  Sep. 29, 2016

(51) Int. Cl.
| H03F 1/02 | (2006.01) |
| H03F 3/45 | (2006.01) |
| H03F 3/08 | (2006.01) |
| H04N 5/3745 | (2011.01) |
| H04N 5/378 | (2011.01) |

(52) U.S. Cl.
CPC .............. *H03F 1/0205* (2013.01); *H03F 3/08* (2013.01); *H03F 3/45071* (2013.01); *H04N 5/378* (2013.01); *H04N 5/3745* (2013.01); *H03F 2203/45116* (2013.01); *H03F 2203/45118* (2013.01)

(58) Field of Classification Search
CPC ... H04N 5/3745; H04N 5/378; H03F 1/0205
See application file for complete search history.

(56) References Cited

U.S. PATENT DOCUMENTS

| 4,786,831 | A | 11/1988 | Morse et al. |
| 5,602,511 | A | 2/1997 | Woolaway |
| 7,002,628 | B1* | 2/2006 | Panicacci ............ H03M 1/1023 341/155 |
| 7,291,822 | B2 | 11/2007 | Olsen et al. |
| 8,274,334 | B2 | 9/2012 | Baud |
| 8,319,307 | B1* | 11/2012 | Williams .......... H01L 27/14636 250/208.1 |
| 2007/0007437 | A1 | 1/2007 | Olsen et al. |
| 2013/0113077 | A1* | 5/2013 | Woo ..................... H01L 23/522 257/532 |

OTHER PUBLICATIONS

Optics & Photonics News; vol. 19, No. 6; pp. 22-27; Jun. 2008.
Murari, Kartikeya et al.; "A CMOS In-Pixel CTIA High Sensitivity Fluorescence Imager"; IEEE Trans Biomed Cicuits Syst.; vol. 5, No. 5; pp. 4449-458; Oct. 2011.

(Continued)

*Primary Examiner* — Ahmed A Berhan
(74) *Attorney, Agent, or Firm* — Snell & Wilmer LLP

(57) ABSTRACT

A capacitive trans-impedance amplifier circuit with charge injection compensation is provided. A feedback capacitor is connected between an inverting input port and an output port of an amplifier. A MOS reset switch has source and drain terminals connected between the inverting input and output ports of the amplifier, and a gate terminal controlled by a reset signal. The reset switch is open or inactive during an integration phase, and closed or active to electrically connect the inverting input port and output port of the amplifier during a reset phase. One or more compensation capacitors are provided that are not implemented as gate oxide or MOS capacitors. Each compensation capacitor has a first port connected to a compensation signal that is a static signal or a toggling compensation signal that toggles between two compensation voltage values, and a second port connected to the inverting input port of the amplifier.

20 Claims, 11 Drawing Sheets

(56) References Cited

OTHER PUBLICATIONS http://electronicdesign.com/site-files/electronicdesign.com/files/archive/electronicdesgin.com; Figure 1. A Transimpedance Amplifier; 1 page; Mar. 26, 2015.

Pease, Bob; "What's All this Transimpedance Amplifier Stuff, Anyhow?"; 7 pages; Jun. 8, 2001.

http://electronicdesign.com/site-files/electronicdesign.com/files/archive/ectronicdesign.com; Figure 4; Mar. 26, 2015.

http://electronicdesign.com/site-files/electronicdesign.com/files/archive/ectronicdesign.com; Figure 3 Diode with Transimpedance Amlifier; Mar. 26, 2015.

http://en.wikipedia.org/wiki/Transimpedance_amplifier; 6 pages; Mar. 26, 2015.

http://www.edaboard.com/thread138751.html; What's the difference of mim and mom cap?; 4 pages; Mar. 26, 2015.

"Metal Oxide Semiconductor (MOS) Capacitor"; Microelectronics Processing Technology 6152J/3155J; 9 pages; 2001, Fall 2001.

MOM Capacitor—Analog Layout and Tools; http://www.linkedin.com/groups/MOM-capacitor; 2 pages; Jan. 11, 2014.

* cited by examiner

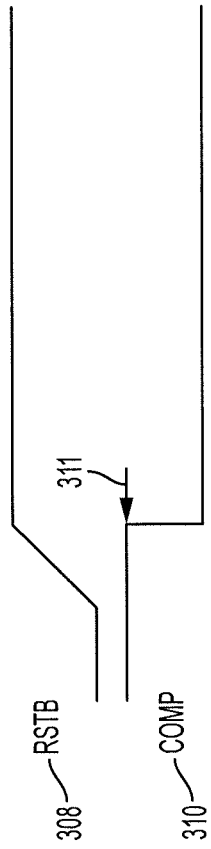
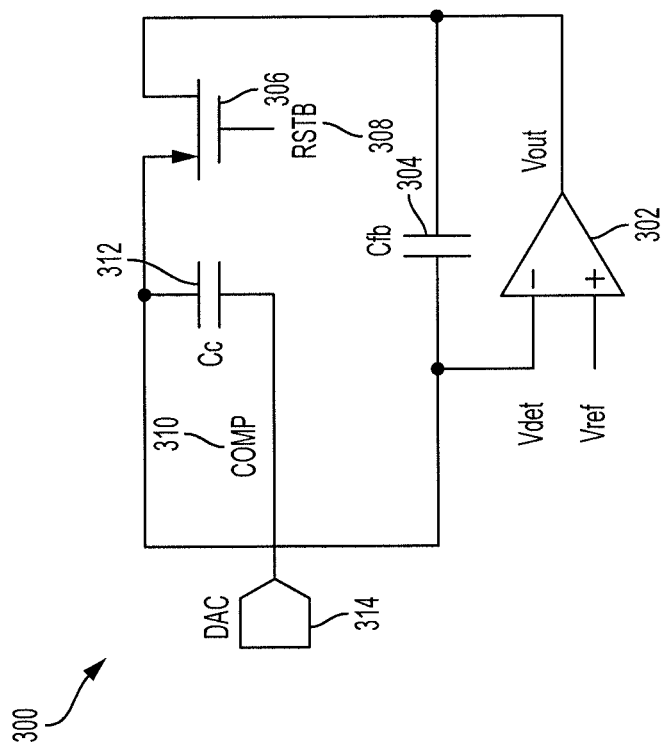
FIG. 3B
FIG. 3A

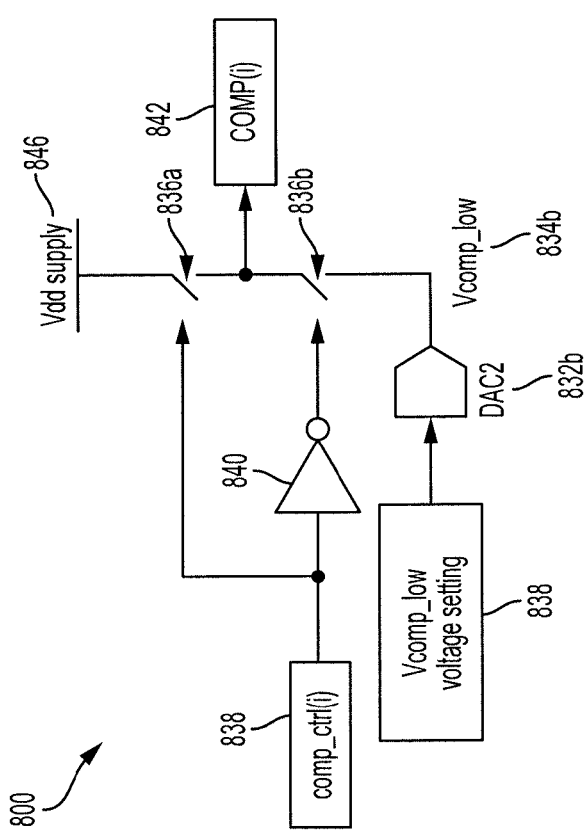
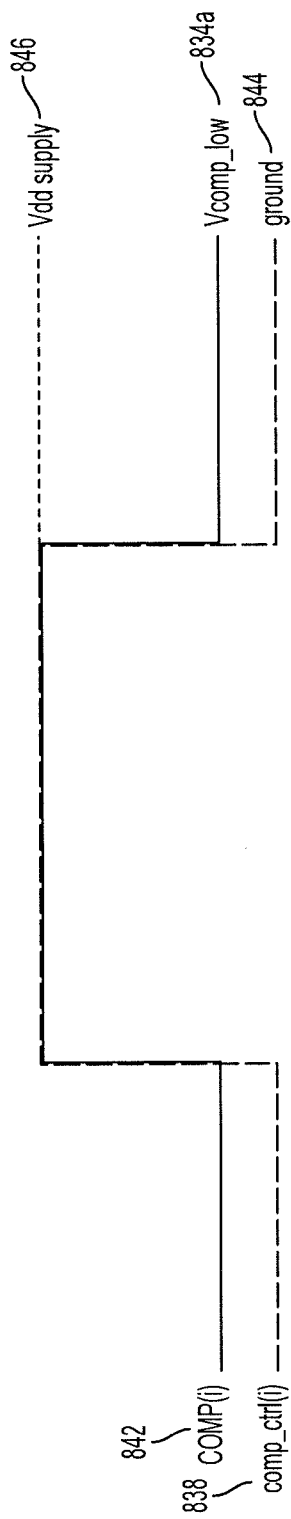
FIG. 8A
FIG. 8B

CAPACITIVE TRANS-IMPEDANCE AMPLIFIER CIRCUIT WITH CHARGE INJECTION COMPENSATION

STATEMENT REGARDING GOVERNMENT RIGHTS

This invention was made with Government support under Government Contract Reference No. NNX13AE57G awarded by National Aeronautics and Space Administration (NASA) Advanced Research Projects Agency. The Government has certain rights in this invention.

BACKGROUND

1. Field

The present disclosure relates to an amplifier circuit, and more particularly, to a capacitive trans-impedance amplifier circuit implemented as a part of a pixel architecture and interfacing with a sensing device such as a photodetector.

2. Description of the Related Art

Capacitive Trans-Impedance Amplifier (CTIA) circuits have been utilized in a variety of applications, for example, in pixel architectures for use with photodetectors. A CTIA circuit converts an input photocurrent or photocharge (for example, from infrared radiation) into an output voltage. The charge-to-voltage conversion gain (usually expressed in microvolts per electron) is determined by the CTIA feedback capacitance. For low levels of infrared radiation and in order to achieve low input-referred noise, the conversion gain needs to be high, which in turn means that the CTIA feedback capacitance needs to be small (e.g., less than 2 femtofarads). In such a scenario, the charge injected by the MOS reset transistor at the CTIA input at the end of the reset phase (when the MOS reset transistor turns off) leads to a large voltage error at the CTIA output. This voltage error significantly reduces the available voltage swing at the CTIA output.

There is a need in the art for a CTIA circuit that can effectively compensate the charge injected by the MOS reset transistor at the CTIA input when the MOS reset transistor turns off. It should also be recognized that the injected charge is subject to variability because it depends on a number of factors such as the slope of the reset clock signal and the impedance at the CTIA input and output. Therefore, there is a need in the art for a CTIA circuit that enables control of, and adjustability in, the amount of charge compensation. It is desirable for the elements of the CTIA circuit to be implemented over a relatively small layout area. It is further desirable to have the ability to compensate small amounts of charge (less than the channel charge of a minimum-sized MOS transistor) and to have uniform charge compensation across the pixel array.

SUMMARY

According to an aspect of the invention, a capacitive trans-impedance amplifier (CTIA) circuit with charge injection compensation is provided. The CTIA circuit includes an amplifier having at least an inverting input port and an output port, and a feedback capacitor connected between the inverting input port of the amplifier and the output port of the amplifier. A reset switch is implemented as a MOS transistor that has a gate terminal, a source terminal and a drain terminal, the source terminal and the drain terminal being connected between the inverting input port and the output port of the amplifier. The gate terminal is controlled by a reset signal. The reset switch is configured to be in a closed or active state for establishing a conductive path between the inverting input port of the amplifier and the output port of the amplifier during a reset phase, and configured to be in an open or inactive state during an integration phase. One or more compensation capacitors are provided, wherein each compensation capacitor is not implemented as a gate oxide or a MOS capacitor. Each compensation capacitor has a first port connected to a compensation signal that is a static signal or a toggling compensation signal that toggles between a first compensation voltage value and a second compensation voltage value. Each compensation capacitor has a second port connected to the inverting input port of the amplifier. A photodiode may be connected to the inverting input port of the amplifier. The photodiode is biased to generate a photocurrent upon receiving photons.

In a preferred embodiment, at least one of the one or more compensation capacitors is a metal-oxide-metal capacitor. The metal-oxide-metal capacitor may include routing metals separated by an oxide material, and having at least one of a lateral finger structure or a vertical structure with two metal layers separated by an oxide layer. One or more of the compensation capacitors may be a metal-oxide-poly capacitor that includes an oxide layer that is used as an isolation layer between a routing metal and a polysilicon layer.

According to an aspect of the invention, the one or more compensation capacitors are a plurality of compensation capacitors configurable to collectively produce a compensation charge deposited at the inverting input port of the amplifier. The compensation charge can be controlled by the number of the plurality of compensation capacitors that receive the toggling compensation signal instead of the static signal.

According to an aspect of the invention, at least one of the first or the second compensation voltage value of the toggling compensation signal is generated by one or more digital-to-analog converters (DACs). The one or more DACs have an input port configured to receive a digital signal capable of having a plurality of combinations of bit values for allowing control of, and variation in, a compensation charge deposited at the inverting input port of the amplifier.

According to another aspect of the invention, a pixel array for a CMOS image sensor is provided. The pixel array has a plurality of pixels arranged in a plurality of rows and a plurality of columns. Each pixel includes a CTIA circuit, for example, with the characteristics set forth above. A transition time of the reset signal from the reset phase to the integration phase may be relatively slow (e.g., greater than 100 nanoseconds) in order to decrease the amount of charge injected at the inverting input port of the amplifier and to enhance uniformity of the output voltage response across the pixel array.

The invention advantageously allows the reset transistor to be minimum-sized in order to substantially reduce or minimize the amount of charge injected at the inverting input port of the amplifier. At the same time, the compensation capacitor (preferably metal-oxide-metal capacitor) can be implemented to provide less compensation charge than the channel charge of a minimum-sized MOS reset transistor. Notably, the compensation capacitor can have a low capacitance value (for example, less than 2 femtofarads) and take a small layout area. The metal-oxide-metal compensation capacitors can be implemented by running compensation control signal metal lines in proximity to a metal layer electrically connected to the inverting input port of the amplifier.

A unique advantage of the invention is that a plurality of compensation capacitors can be provided, each being either toggled or in a static state, thereby allowing control of and variation in the amount of charge compensation. Alternatively, or in addition, one or more DACs can be utilized to adjust one or more compensation voltage values of the toggling compensation signals in order to allow control of and variation in the amount of charge compensation. In addition, the invention provides a simple method of injecting an adjustable signal at the inverting input port of the amplifier, which can be beneficial for screening of defective pixels and testing of the CTIA circuits before hybridization to a detector layer.

BRIEF DESCRIPTION OF THE DRAWINGS

Other systems, methods, features, and advantages of the present disclosure will be or will become apparent to one with skill in the art upon examination of the following figures and detailed description. It is intended that all such additional systems, methods, features, and advantages be included within this description, be within the scope of the present disclosure, and be protected by the accompanying claims. Component parts shown in the drawings are not necessarily to scale, and may be exaggerated to better illustrate the important features of the present disclosure. The first digit of each reference number generally indicates the figure in which the element first appears. In the drawings, like reference numerals designate like parts throughout the different views, wherein:

FIG. 3A is a schematic diagram of a CTIA circuit that uses an n-bit Digital-to-Analog Converter (DAC) for charge injection compensation according to an embodiment of the present invention;

FIG. 3B includes two graphs showing a reset signal and a compensation signal for operating the CTIA circuit of FIG. 3A according to one of various configurations;

FIG. 8A is a schematic diagram of a compensation signal generator, wherein the low compensation voltage value is generated by a DAC and the high compensation voltage value is the supply voltage according to an embodiment of the present invention;

FIG. 8B shows a CMOS control signal and a compensation signal, the former being the input and the latter the output, of the compensation signal generator of FIG. 8A.

DETAILED DESCRIPTION

Apparatus, systems and methods that implement the various features of the present disclosure will now be described with reference to the drawings. The drawings and the associated descriptions are provided to illustrate some implementations of the present disclosure and not to limit the scope of the present disclosure. Throughout the drawings, reference numbers are reused to indicate correspondence between reference elements.

Figure 1A:
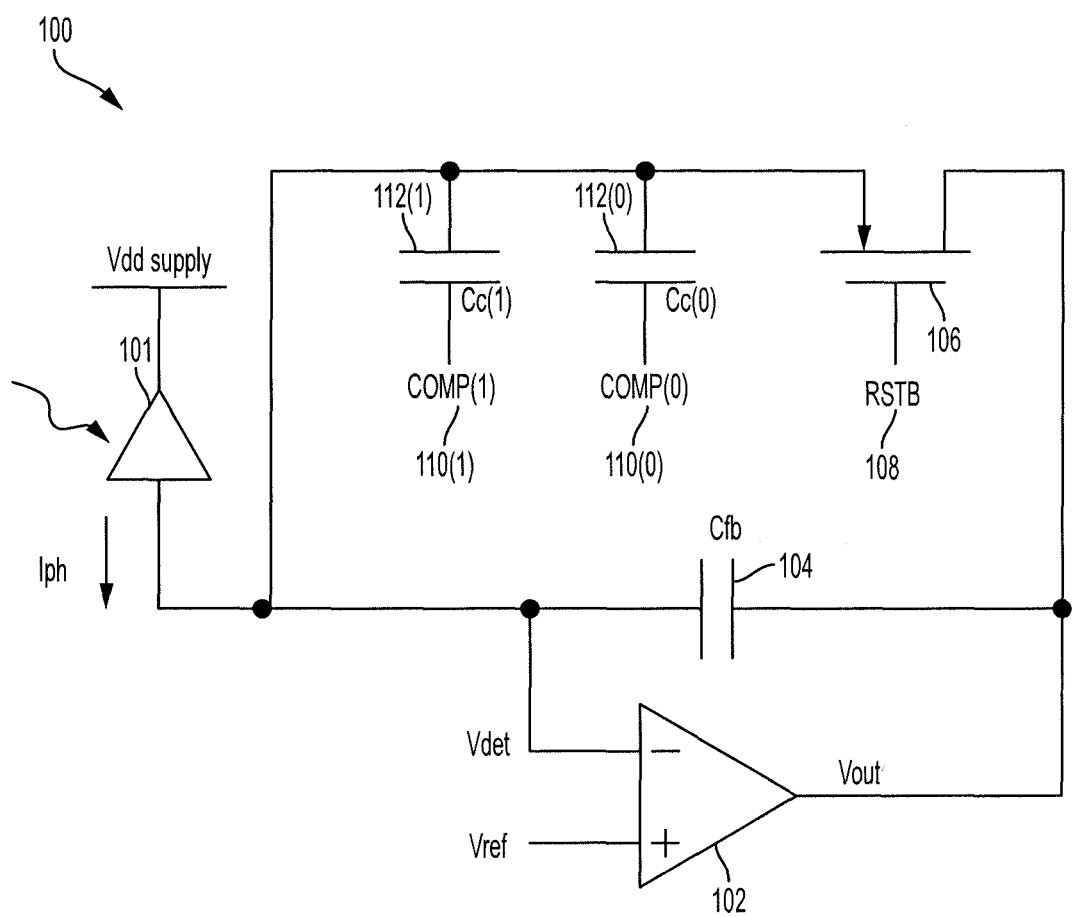
FIG. 1A is a schematic diagram of a Capacitive Trans-Impedance Amplifier (CTIA) circuit with charge injection compensation according to an embodiment of the present invention.

FIG. 1A shows a Capacitive Trans-Impedance Amplifier (CTIA) circuit 100 with charge injection compensation. The discussion begins with a general description of the elements of the CTIA circuit 100 and their functionality.

The amplifier 102 shown in FIG. 1A is a differential input amplifier having a non-inverting input port (V+) connected to a reference voltage (Vref) which may be held substantially constant; an inverting input port (V−); and a single-ended output port (Vout). Alternatively, the amplifier 102 may be a single-ended amplifier with an inverting input port and a single-ended output port. The amplifier 102 has a high gain in order to maintain the inverting input port (hereinafter denoted by Vdet) substantially as a virtual ground. The inverting input port (Vdet) may be connected to a detector that includes, for example, a photodiode 101. The photodiode 101 is biased to generate a photocurrent upon receiving photons.

The photodiode 101 as used herein refers to any electronic element that produces photoelectrons in response to light. The photodiode may be a p-n junction diode, a p-i-n junction diode (with an undoped intrinsic semiconductor region between a p-type and an n-type semiconductor), or various other photodiodes. Alternatively, the CTIA circuit 100 may be connected to other devices or elements that produce a current or charge at the inverting input port (Vdet). In certain hybrid implementations, the photodiodes 101 may be implemented on a detector wafer that is separate from the CMOS wafer on which the CTIA circuit is implemented. The detector wafer may be connected to the CMOS wafer via indium interconnects.

A feedback capacitor 104 is connected between the inverting input port (Vdet) and the output port (Vout) of the amplifier 102. The feedback capacitance Cfb may be, for example, 2 femtofarads (fF) or smaller to support a high conversion gain, as discussed in further details below with respect to charge injection.

A reset switch 106 is implemented as a MOS transistor having a gate terminal, a source terminal and a drain terminal. The source terminal and the drain terminal are connected between the inverting input port (Vdet) and the output port (Vout) of the amplifier 102. The gate terminal is controlled by a reset signal 108 denoted by RSTB. The reset switch 106 is configured to be in a closed or active state for establishing a conductive path between the inverting input port (Vdet) and the output port (Vout) during a reset phase. The reset switch 106 is further configured to be in an open or inactive state during an integration phase.

In the embodiment shown in FIG. 1A, the reset switch 106 is a PMOS transistor. In another embodiment, the reset switch 106 may be an NMOS transistor without limiting the scope of the present invention. In an NMOS implementation, the polarity of the reset signal 108 and compensation signals COMP(0) 110(0) and COMP(1) 110(1) would be reversed, for example, as discussed below with respect to FIGS. 5A and 5B. In an NMOS implementation, the photocurrent Iph of the photodiode 101 would instead flow from the inverting input port (Vdet) to ground or a low voltage port.

Figure 1B:
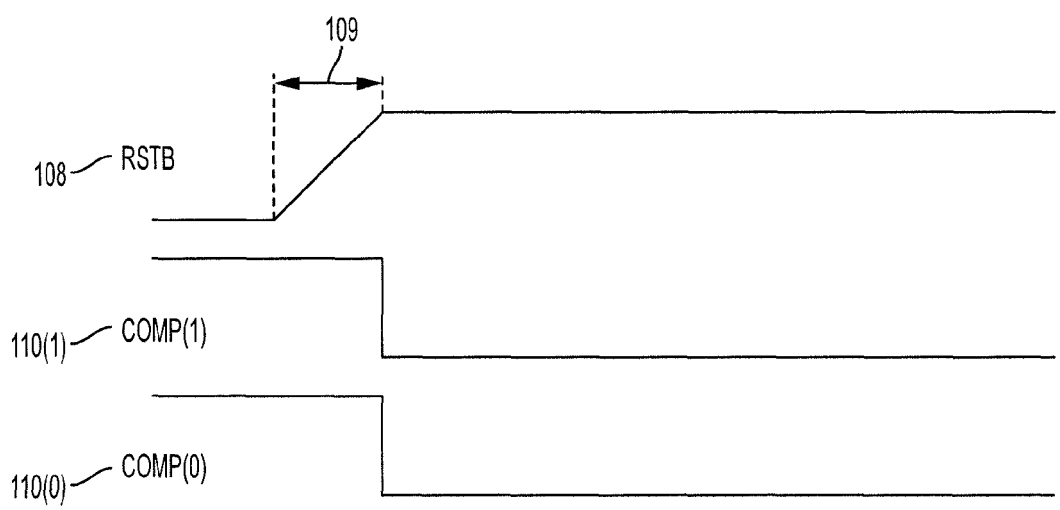
FIG. 1B is a series of graphs showing a reset signal and compensation signals for operating the CTIA circuit of FIG. 1A according to one of various configurations wherein all compensation capacitors are toggled.

FIG. 1B is a series of graphs showing an example of the reset signal (RSTB 108) for operating the CTIA circuit 100 of FIG. 1A. The reset signal (RSTB 108) has a first voltage value during the reset phase, and a second voltage value greater than the first voltage value during the integration phase. In a preferred embodiment, the PMOS reset switch 106 is turned on fully during the reset phase and turned off fully during the integration phase. The first voltage value of the reset signal (RSTB 108) may be substantially equal to zero (ground), and the second voltage value may be equal to a high voltage value corresponding to the voltage supply (Vdd supply).

During the reset phase, the PMOS reset switch 106 connects the inverting input port (Vdet) and the output port (Vout) of the amplifier 102 in order to reset the output port (Vout) to the reset value (e.g., Vref). Also, during the reset phase, the charge on the feedback capacitor (Cfb 104) is cleared. During the integration phase, the PMOS reset switch 106 opens (or is deactivated). The photocurrent Iph of photodiode 101 flows through and is integrated as charge on the feedback capacitor (Cfb 104). Since the inverting input port (Vdet) remains substantially at a virtual ground, the voltage Vout at the output port decreases with time during the integration phase as the charge stored on Cfb 104 increases. In an NMOS implementation, for which the photocurrent Iph of the photodiode 101 flows from the inverting input port (Vdet) to ground, the voltage Vout at the output port increases with time during the integration phase.

For small photocurrents, the feedback capacitance Cfb is designed to be small (e.g., 2 fF or less). This increases the charge-to-voltage conversion gain of the CTIA circuit 100 and also decreases its input-referred noise (in electrons). Indeed, the conversion gain of the CTIA circuit 100 (in μV/e−) is inversely proportional to Cfb and more particularly, equals qe/Cfb where qe is the charge of the electron.

In order to illustrate the advantages of the compensation capacitors of the present invention, this paragraph discusses some of the problems associated with charge injection in the absence of adequate compensation. When the reset signal (RSTB 108) switches from a first voltage value (a low voltage value for PMOS implementations) to a second voltage value (a high voltage value for PMOS implementations), the PMOS reset switch 106 turns off and some portion of its channel charge is injected as positive charge Δq at the inverting input port (Vdet). Without adequate compensation, this positive charge Δq would be integrated on Cfb 104 and, and as soon as the CTIA circuit 100 settles, would lead to a voltage error at the CTIA output equal to ΔVerr=−Δq/Cfb. For a small feedback capacitance (e.g., less than 2 fF), the absolute value of ΔVerr can be quite large (>1 V). More particularly, |ΔVerr| is large in part because the feedback capacitance is designed to have a low value to support a high gain for detection of small photocurrents. Considering the negative sign of the voltage error, the CTIA output at the start of integration is ΔVerr below the reset voltage. This results in a significant loss in output voltage swing (as high as 50% in certain embodiments), where voltage swing, as used herein, refers to the difference between the maximum and the minimum output voltage within the linear range of the amplifier 102. In order to maximize the signal dynamic range, it is desirable to have an output voltage swing that is as close as feasible (and as allowed by the design parameters and concerns) to the difference between Vdd supply and Vss, which are the maximum and minimum voltage values of the power supply terminals for the CTIA circuit 100, respectively. Vss may be substantially equal to zero (ground) in CMOS sensor applications. In order to prevent or substantially reduce the loss of output swing due to the reset switch charge injection, a compensation charge of opposite polarity is deposited at the inverting input port (Vdet).

The CTIA circuit 100 includes one or more compensation capacitors 112(0) and 112(1). Each compensation capacitor is not implemented as a gate oxide or a MOS capacitor and hence its capacitance can be smaller than that of a minimum-sized MOS capacitor. In the embodiment shown in FIG. 1A, the CTIA circuit 100 includes two differently-sized compensation capacitors Cc(0) 112(0) and Cc(1) 112(1). The first port of the first compensation capacitor Cc(0) 112(0) is connected to a first compensation signal COMP(0) 110(0), and the first port of the second compensation capacitor Cc(1) 112(1) is connected to a second compensation signal COMP (1) 110(1). Each compensation capacitor has a second port connected to the inverting input port (Vdet). Each compensation signal may be a static signal or, as shown as an example in FIG. 1B, a toggling compensation signal that toggles between a first compensation voltage value and a second compensation voltage value.

The CTIA circuit 100 utilizes compensation capacitors that compensate the charge injected by the reset switch at the inverting input port (Vdet). More particularly, as the reset signal (RSTB 108) switches from the first voltage value (low for PMOS switch implementations) to the second voltage value (high for PMOS switch implementations), the reset switch 106 turns off and injects charge (e.g., Δq) at the inverting input port (Vdet). The toggling compensation signals COMP(0) 110(0) and COMP(1) 110(1) are timed such that they switch from a first compensation voltage value (high for PMOS switch implementations) to a second compensation voltage value (low for PMOS switch implementations) after the reset switch 106 turns off. This timing ensures that the compensation charge has an opposite polarity of the charge injected by the reset switch and that all the compensation charge is deposited at the inverting input port (Vdet) instead of flowing through the reset switch to the output port (Vout).

If both compensation signals COMP(0) 110(0) and COMP(1) 110(1) are toggling as shown in FIG. 1B, the total compensation charge equals (Cc(0)+Cc(1))(Vcomp_high−Vcomp_low), where Vcomp_high and Vcomp_low are the high and low compensation voltage values, respectively. If only COMP(0) 110(0) is toggling, then the compensation charge equals Cc(0) (Vcomp_high−Vcomp_low). Similarly, if only COMP(1) 110(1) is toggling, then the compensation charge equals Cc(1)(Vcomp_high−Vcomp_low). If Cc(0) and Cc(1) are binary ratioed, then this example shows that the compensation charge can take four discrete values (from zero compensation to maximum compensation), depending on whether COMP(0) 110(0), COMP(1) 110(1) or both are toggling. The first compensation voltage Vcomp_high may be a high voltage corresponding to the supply voltage (Vdd supply), and the second compensation voltage Vcomp_low may be substantially equal to zero (ground). Also, as will be discussed later, another method of adjusting the compensation charge is by varying one or both of the first and second compensation voltages Vcomp_high and Vcomp_low by means of Digital-to-Analog Converters (DACs). In summary, the toggled compensation capacitors collectively deposit a compensation charge with an opposite polarity of the charge injected at the inverting input port (Vdet) by the reset switch. As a result, there is no negative voltage error at the CTIA output and the CTIA output swing is maximized.

It is desirable for the MOS reset transistor to be minimum-sized in order to minimize its channel charge and hence the charge injected at the inverting input port (Vdet). The portion of the reset transistor channel charge that is injected at Vdet is further minimized by having a slow transition of RSTB signal at the end of reset as shown in FIG. 1B. Since not all the channel charge from the MOS reset transistor ends up at Vdet, the compensation charge needs to be smaller than the channel charge of a minimum-sized MOS. However, this is not a problem for the CTIA circuit according to the invention because the compensation capacitor is not implemented as a gate oxide or MOS capacitor. It can therefore be designed to provide as small of a compensation charge as needed to cancel the charge injected by the minimum-sized MOS reset transistor 106. As a result, the reset transistor and the one or more compensation capacitors take a small layout area.

In a preferred embodiment, one or more of the compensation capacitors are metal-oxide-metal capacitors including routing metals separated by an oxide material. One or more of the compensation capacitors may have a lateral structure in which metals are coupled on the same level. The coupling can be made using a finger structure to increase capacitance per unit area. One or more of the compensation capacitors may have a vertical structure with two metal layers on different levels separated by an oxide layer.

One or more of the compensation capacitors may be implemented as a metal-oxide-poly capacitor. A metal-oxide-poly capacitor includes an oxide layer that is used as an isolation layer between a routing metal and a polysilicon layer. Alternatively, a combination of metal-oxide-metal and metal-oxide-poly capacitors may be utilized in the CTIA circuits.

The discussion now turns to unique advantages of the invention with respect to control of and variation in a compensation charge deposited at the inverting input port (Vdet). According to an embodiment, the invention advantageously utilizes more than one compensation capacitors collectively to produce a compensation charge deposited at the inverting input port (Vdet). The compensation charge is controlled by the number of the compensation capacitors that receive the static signal, and the number of the plurality of compensation capacitors that receive the toggling compensation signal. If n binary-scaled compensation capacitors (Cc(0) to Cc(n−1)) are used, there are $2^n$ (two to the power of n) possible compensation settings.

Figures 5A, 5B:
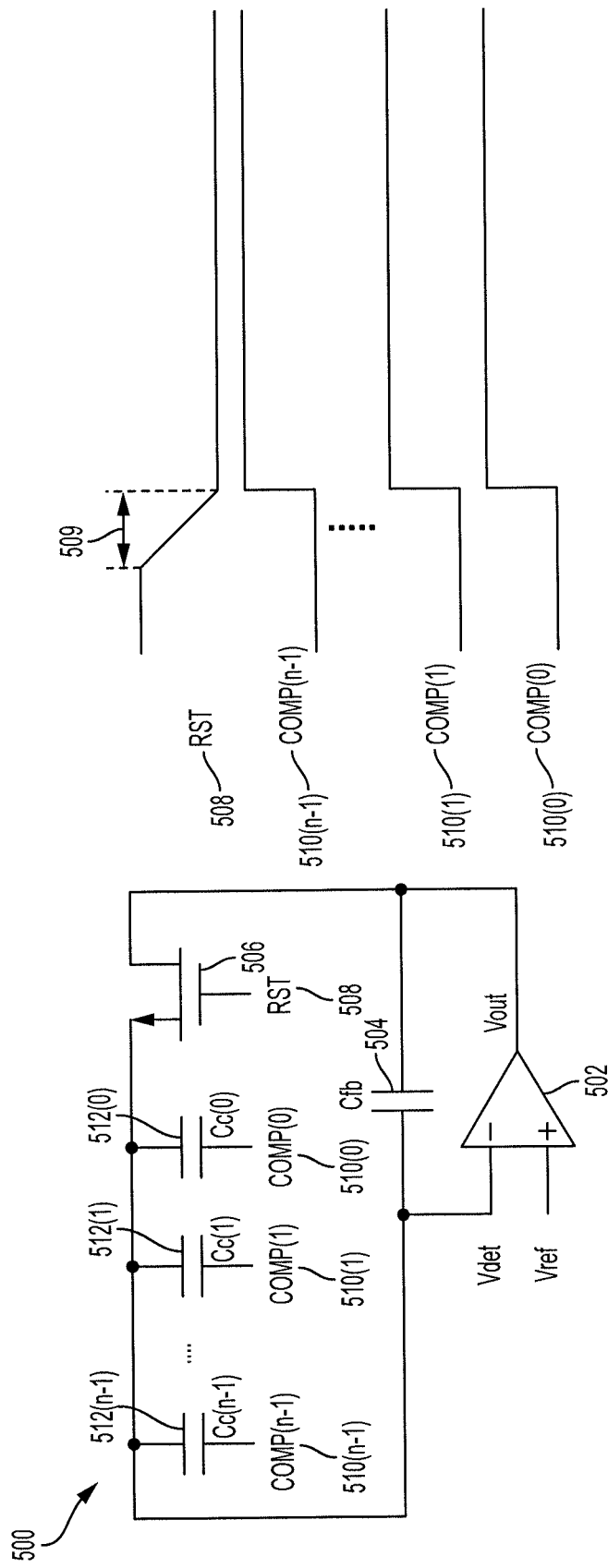
FIG. 5A is a schematic diagram of a CTIA circuit having multiple differently-sized compensation capacitors and an NMOS reset switch, according to an alternative embodiment of the present invention.
FIG. 5B is a series of graphs showing a reset signal and compensation signals for operating the CTIA circuit of FIG. 5A according to one of various configurations, wherein each compensation capacitor receives a toggling compensation signal.

A plurality of CTIA circuits 100 shown in FIG. 1A may be utilized in a pixel array (as discussed in further details below with respect to FIG. 9). In this case, the reset and compensation signals are common to a number of pixels and span a large distance. Because of RC propagation delay, the rise and fall times of the compensation signals and the reset signal transition time may vary across the array. The reset signal transition time refers to the RSTB rise time 109 for implementations that utilize a PMOS reset switch (e.g., FIGS. 1A and 1B), and RST fall time 509 for implementations that utilize a NMOS reset switch (FIGS. 5A and 5B). The invention advantageously provides uniformity in charge injection amongst the pixels because the transition time is designed to be much longer than the RC propagation delay of the reset signal. The invention also advantageously provides uniformity in charge compensation because the rise and fall times of compensation signals do not affect the amount of compensation charge deposited at the inverting input port (Vdet). As a result, the pixels have uniform characteristics and responses despite variations in reset and compensation signal timing.

Figure 2:
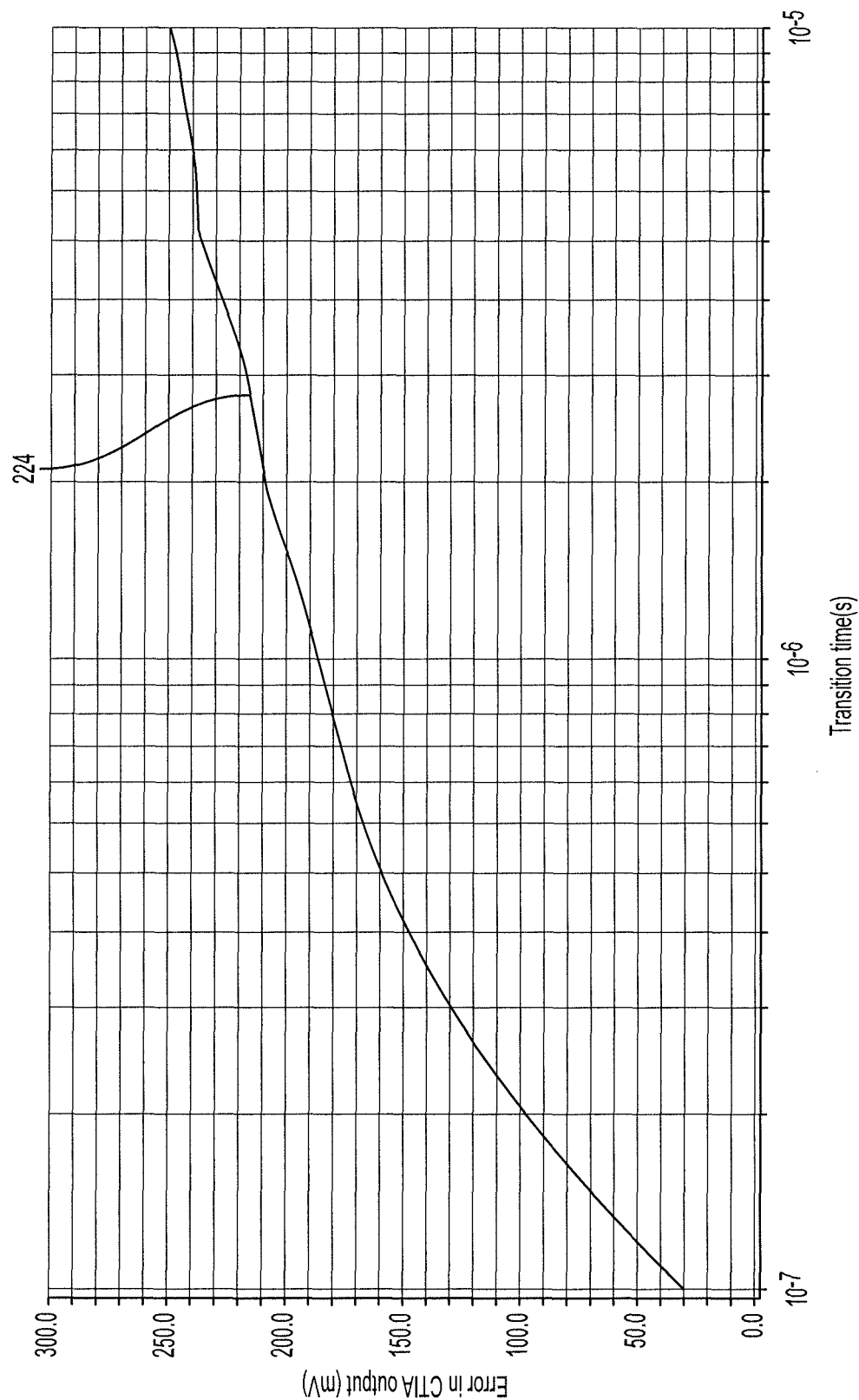
FIG. 2 is a graph indicating output voltage error of a CTIA circuit as a function of a transition time of a reset signal according to an embodiment of the present invention.

FIG. 2 is a graph plotting error in the output voltage (Vout) of a CTIA circuit (e.g., the CTIA circuit 100 shown in FIG. 1A) as a function of a transition time of a reset signal (e.g., RSTB rise time 109 shown in FIG. 1B). The y-axis is a linear scale of error in output voltage of the CTIA circuit (Vout) in millivolts (mV), and the x-axis is a logarithmic scale of the transition time from 100 nanoseconds (ns) to 10 microseconds (μs). The assumed feedback capacitance in this example is 0.26 femtofarad (fF).

As can be seen from FIG. 2, the output voltage (Vout) varies by less than 250 mV over a very wide range of transition times (from 100 ns to 10 μs). If the transition time is designed to be 1 μs, then when a typical 10 ns RC propagation delay is added to it, the transition time of the reset signal may vary across the pixel array from 1 μs to 1.01 μs. As can be seen from FIG. 2, the CTIA output voltage error will stay very nearly the same over this interval, thus confirming that the CTIA circuit is not sensitive to propagation delay variation of the reset signal (e.g., reset signal RSTB 108).

When the transition time is long, the output voltage error is significantly less susceptible to variation in the transition time across the pixel array (for example, due to RC propagation delay). As an example, for a short transition time (e.g., less than 50 ns), the corresponding output voltage error would be much more adversely affected by an RC propagation delay in the order of 10 ns than for a transition time of 1 μs. Therefore, the invention advantageously utilizes a relatively slow transition time in order to render the output voltage error of the CTIA pixels to be uniform across the pixel array.

In addition to enhancing uniformity, increasing the transition time provides yet another advantage in that less charge is injected into the inverting input port (Vdet) (because the portion of charge that is deposited at the output voltage port (Vout) increases). In one embodiment, the transition time according to the invention is greater than 100 ns. In certain embodiments, the transition time may be greater than or equal to 0.5 μs and less than or equal to 5 μs. For example, the transition time may be around 1 μs. It should be noted that, as seen in FIG. 2, the output voltage error for a transition time of 1 μs is not zero, but slightly positive (about 180 mV). This is in fact advantageous for single-ended CTIA implementations, in which the reset voltage level is non-adjustable and may be a threshold below the supply voltage. Having a slight positive output error means that CTIA integration will start slightly above (e.g. 180 mV above) the reset level. In this way, the CTIA output swing is in fact increased.

FIG. 3A shows a CTIA circuit 300 having an n-bit DAC 314 for charge injection compensation. FIG. 3B is a series of graphs showing a reset signal RSTB 308 and a compensation signal COMP 310 for operating the CTIA circuit 300. Although a single compensation capacitor (Cc 312) is provided in this embodiment, the compensation charge can be fine-tuned by varying the output of the DAC 314. For the n-bit DAC 314, $2^n$ possible compensation configurations may be provided. For example, an 8-bit DAC can be utilized to provide 256 levels of compensation.

As shown in FIG. 3B, the compensation voltage value 311 is controlled by the output of the DAC 314. The DAC 314 has an input port configured to receive a digital signal capable of having a plurality of combinations of bit values for allowing control of and variation in the compensation charge.

In the embodiment shown in FIG. 3B, only the high voltage value 311 is controlled by the DAC 314, and the low voltage value is substantially equal to ground. In another embodiment, the low voltage value may be controlled by the DAC 314, while the high voltage value is substantially equal to a high voltage value corresponding to Vdd supply. As such, the invention advantageously allows charge compensation to be fine-tuned to match the charge injection at the inverting input port (Vdet).

In the embodiment in which the CTIA circuits 300 are utilized in a pixel array (as discussed in further details with respect to FIG. 9), a global or shared DAC can be used for the pixel array. This significantly reduces the complexity and the number of circuit elements utilized for charge compensation.

Figure 4A:
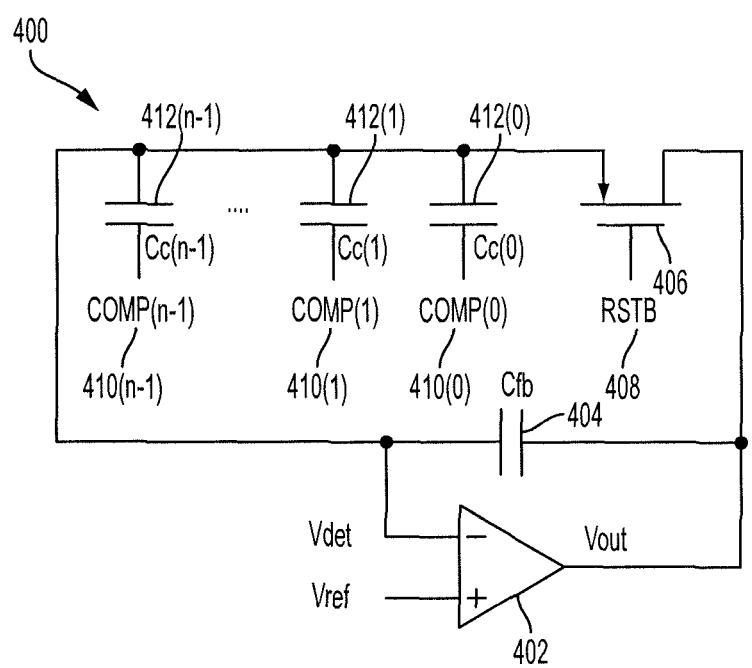
FIG. 4A is a schematic diagram of a CTIA circuit having multiple differently-sized compensation capacitors and a PMOS reset switch according to an embodiment of the present invention.

FIG. 4A is a schematic diagram of a CTIA circuit 400 having compensation capacitors, each compensation capacitor receiving a toggling compensation signal. None, some, or all of the compensation capacitors can be toggled, in order to vary the amount of compensation charge based on design targets. This is discussed below with respect to the timing diagrams shown in FIGS. 4B-4E, where all timing diagrams refer to the CTIA circuit of FIG. 4A.

Figure 4B:
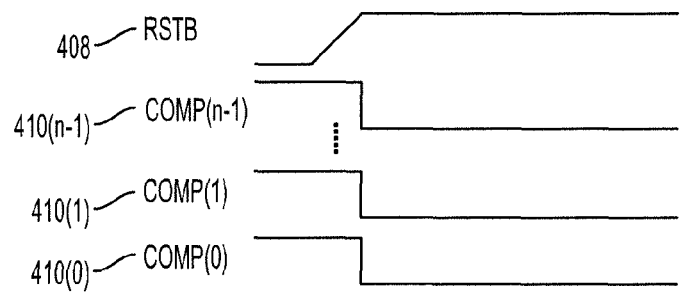
FIG. 4B is a timing diagram showing a reset signal and toggling compensation signals for operating the CTIA circuit of FIG. 4A according to one of various configurations, wherein each compensation capacitor receives a toggling compensation signal.

FIG. 4B is a timing diagram showing a reset signal and toggling compensation signals for operating the CTIA circuit 400 of FIG. 4A according to one of various configurations. Since all compensation capacitors are toggled in the shown state of this embodiment, the maximum compensation charge (out of the $2^n$ possible configurations) is applied. In other words, Cc(0) 412(0), Cc(1) 412(1), ..., Cc(n−1) 412(n−1) are all toggled because all of the compensation signals (COMP(0) 410(0), COMP(1) 410(1), ... COMP(n−1) 410(n−1)) are toggling compensation signals (none of them are static signals).

Figure 4C:
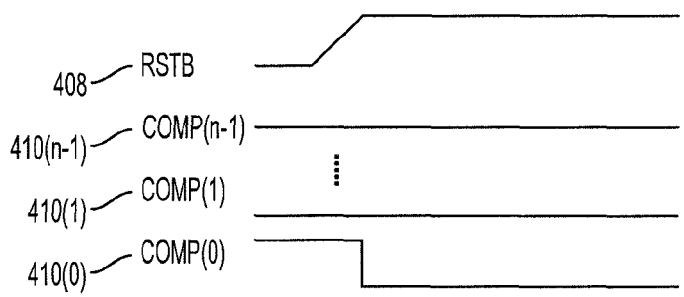
FIG. 4C is a timing diagram showing a reset signal and compensation signals for operating the CTIA circuit of FIG. 4A according to one of various configurations, wherein only the first compensation capacitor receives a toggling compensation signal.

Alternatively, as shown in FIG. 4C, only the first compensation capacitor receives a toggling compensation signal COMP(0) 410(0) and the remaining compensation capacitors are in a static state (receive static signals COMP(1) 410(0), ... COMP(n−1) 410(n−1). If we assume that Cc(0) 410(0) is the smallest compensation capacitor, then minimum charge compensation is applied.

Figure 4D:
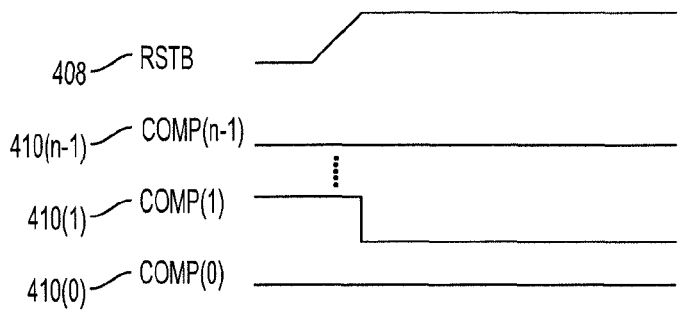
FIG. 4D is a timing diagram showing a reset signal and compensation signals for operating the CTIA circuit of FIG. 4A according to one of various configurations, wherein only the second compensation capacitor receives a toggling compensation signal.

The following example illustrates an advantage of this configuration. Assuming Cc(1) 412(1) has twice the capacitance of Cc(0) 412(0), and it is desirable to double the compensation, COMP(0) 410(0) can be set to be a static signal, while Cc(1) 412(1) receives a toggling compensation signal COMP(1) 410(1), as shown in FIG. 4D. As a result, compensation is doubled as compared with the embodiment shown in FIG. 4C.

Figure 4E:
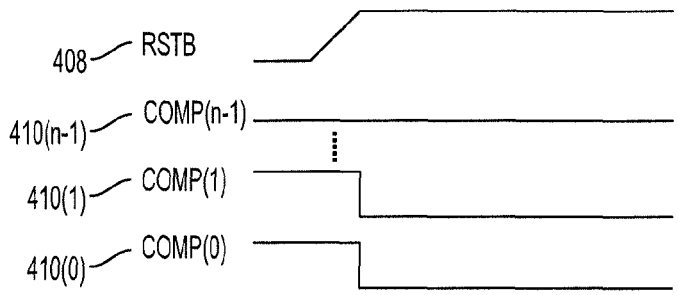
FIG. 4E is a timing diagram showing a reset signal and compensation signals for operating the CTIA circuit of FIG. 4A according to one of various configurations, wherein only the first and the second compensation capacitors receive toggling compensation signals.

If a compensation capacitance is needed with three times the compensation capacitance of the embodiment in FIG. 4C, then Cc(0) and Cc(1) can both be toggled, as shown in FIG. 4E.

The foregoing configurations are discussed for illustration purposes. The invention advantageously allows $2^n$ configurations when n differently-sized capacitors are utilized. The configurations enable advantageous design flexibility to fine tune an effective value of compensation capacitance for the CTIA circuits.

FIG. 5A is a schematic diagram of an alternative implementation of the CTIA circuit 500 that utilizes an NMOS reset switch 506. FIG. 5B is a timing diagram showing a reset signal 505 and compensation signals COMP(0) 510(0), .... COMP(n−1) 510(n−1) for operating the CTIA circuit 500 of FIG. 5A. Because an NMOS reset switch 506 is utilized, the polarity of the signals is reversed as compared with the embodiments discussed above with respect to FIGS. 1A, 1B and 3A-4E. The reset signal RST 508 has a first voltage value during the reset phase (e.g., Vdd supply), and a second voltage value less than the first voltage value (e.g., zero or ground) during the integration phase. The toggling compensation signal of each compensation capacitor is equal to a first compensation voltage value during the reset phase and transitions to a second compensation voltage value a fixed delay after the start of the integration phase. The second compensation voltage value (e.g., Vdd supply) is greater than the first compensation voltage value (e.g., zero or ground). In the configuration shown in FIG. 5B all compensation capacitors are toggled. In other configurations, one or more of the compensation capacitors may receive a static signal.

The discussion now turns to exemplary implementations using one or more DACs in order to control only the low compensation voltage value, only the high compensation voltage value, or both low and high compensation voltage values.

Figure 6A:
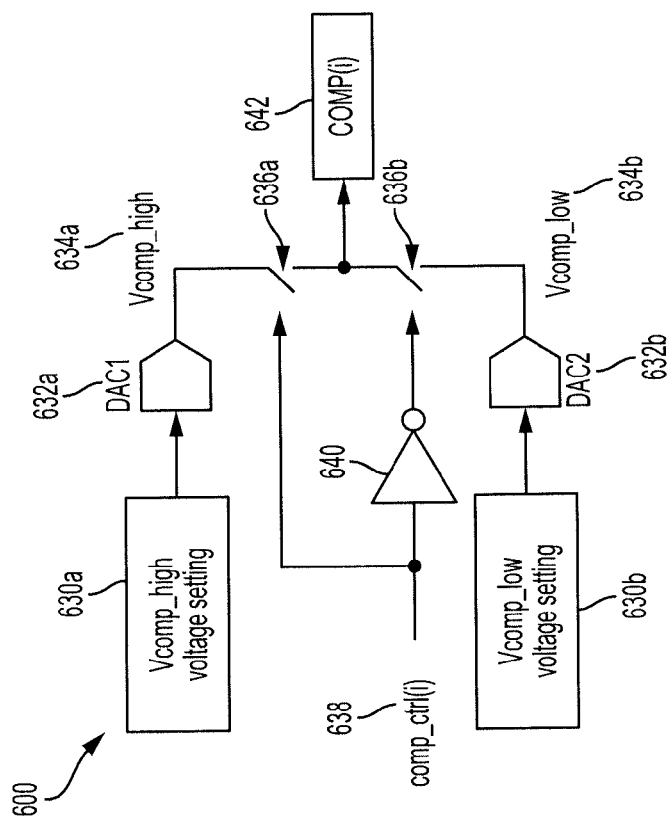
FIG. 6A is a schematic diagram of a compensation signal generator, wherein the high and low compensation voltage values are driven by two DACs, according to an embodiment of the present invention.
Figure 6B:
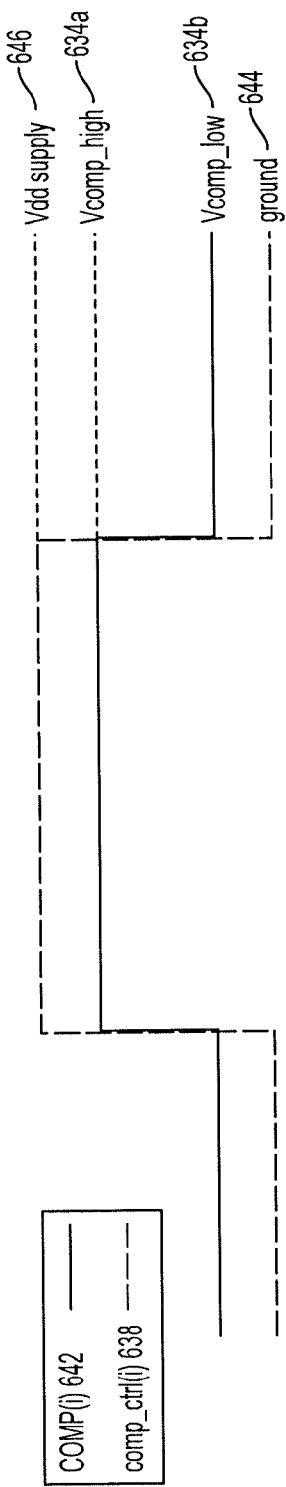
FIG. 6B shows a CMOS control signal and a compensation signal, the former being the input and the latter the output, of the compensation signal generator of FIG. 6A.

FIG. 6A is a schematic diagram of a compensation signal generator 600 having two DACs for controlling low and high compensation values for charge injection compensation. FIG. 6B shows a CMOS control signal and a compensation signal, the former being the input and the latter the output, of the compensation signal generator of FIG. 6A.

The toggling compensation signal COMP(i) 642 of at least one of the one or more compensation capacitors toggles between Vcomp_high 634a (a high compensation voltage value) and Vcomp_low 634b (a low compensation voltage value), where Vcomp_high 634a and Vcomp_low 634b are the voltage outputs of DACs 632a and 632b, respectively. A compensation control signal comp_ctrl(i) 638, which may be a CMOS signal (with high and low voltage values being equal to the supply rails), is the input to the compensation signal generator. The output of the compensation signal generator 600 is the toggling compensation signal COMP(i) 642, which has substantially the same timing as the comp_ctrl(i) 638.

The compensation control signal comp_ctrl(i) 638 controls switching between the output of the first DAC 632a and the output of the second DAC 632b. Namely, when comp_ctrl(i) 638 is high, switch 636a is closed and switch 636b is open. This connects the toggling compensation signal COMP(i) 642 to the output of the first DAC Vcomp_high 634a. When comp_ctrl(i) 638 is low, switch 636b is closed and switch 636a is open. This connects the toggling compensation signal COMP(i) 642 to the output of the second DAC Vcomp_low 634b. In FIG. 6A it is assumed that both switches 636a and 636b are implemented as NMOS switches. Therefore, switch 636b is driven by the opposite phase of the compensation control signal comp_ctrl(i) 638, where this opposite phase is generated by an inverter 640. Alternatively, if switch 636a is a PMOS switch and switch 636b is a NMOS switch, then both switches 636a and 636b can be driven by the compensation control signal comp_ctrl(i) 638.

Figure 7A:
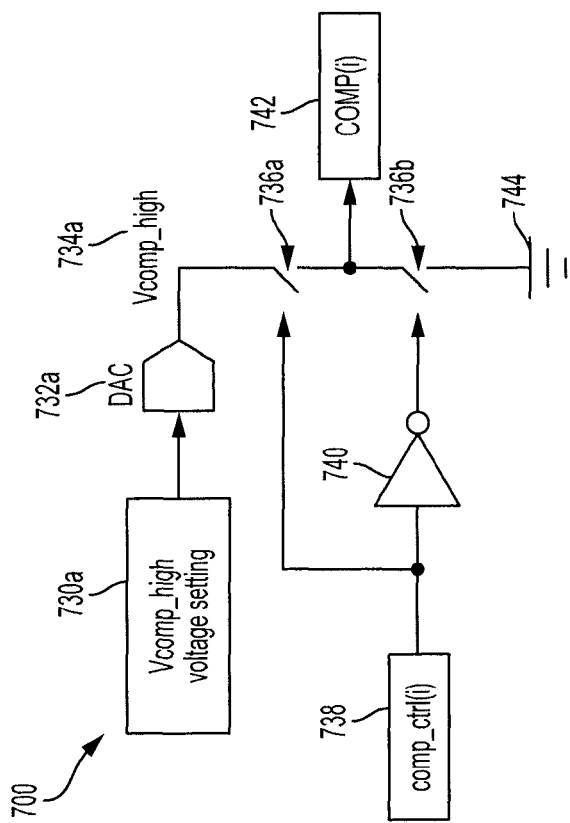
FIG. 7A is a schematic diagram of a compensation signal generator, wherein the high compensation voltage value is generated by a DAC and the low compensation voltage value is ground, according to an embodiment of the present invention.
Figure 7B:
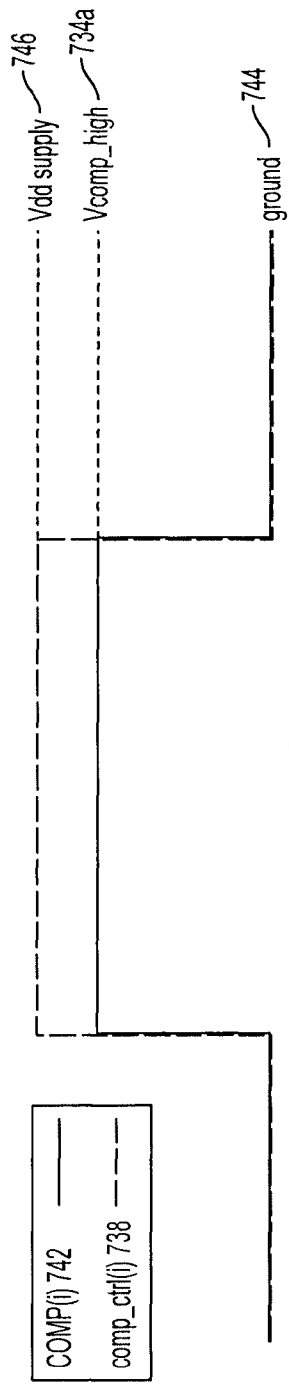
FIG. 7B shows a CMOS control signal and a compensation signal, the former being the input and the latter the output, of the compensation signal generator of FIG. 7A.

FIGS. 7A and 7B show a compensation signal generator 700 having a DAC 732a for controlling a high compensation voltage value for charge injection compensation. This embodiment has similar operation and signal timing to the embodiment discussed above with respect to FIGS. 6A and 6B, except the second DAC 632b is replaced with a substantially constant low voltage value (ground 744).

FIGS. 8A and 8B show a compensation signal generator 800 having a DAC 832b for controlling a low compensation voltage value for charge injection compensation. This embodiment has similar operation and signal timing to the embodiment discussed above with respect to FIGS. 6A and 6B, except the first DAC 632a is replaced with a constant voltage (Vdd supply 846).

As discussed above with respect to FIGS. 4A-8B, in some embodiments the compensation charge is adjusted by having multiple compensation capacitors and sending toggling compensation signals to some of them and a static signal to others. Another embodiment may use a single compensation capacitor, but control one or both of the compensation voltage values by means of one or two DACs as discussed above with respect to FIGS. 3A, 3B and 6A-8B. In alternative embodiments, both adjustment methods can be combined by having multiple compensation capacitors that receive toggling compensation signals whose upper and/or lower compensation voltage values are controlled by DACs. For example, using three compensation capacitors and a 5-bit DAC to drive the upper compensation voltage value yield a total of $2^{(3+5)}=256$ adjustment settings of the compensation charge.

Figure 9:
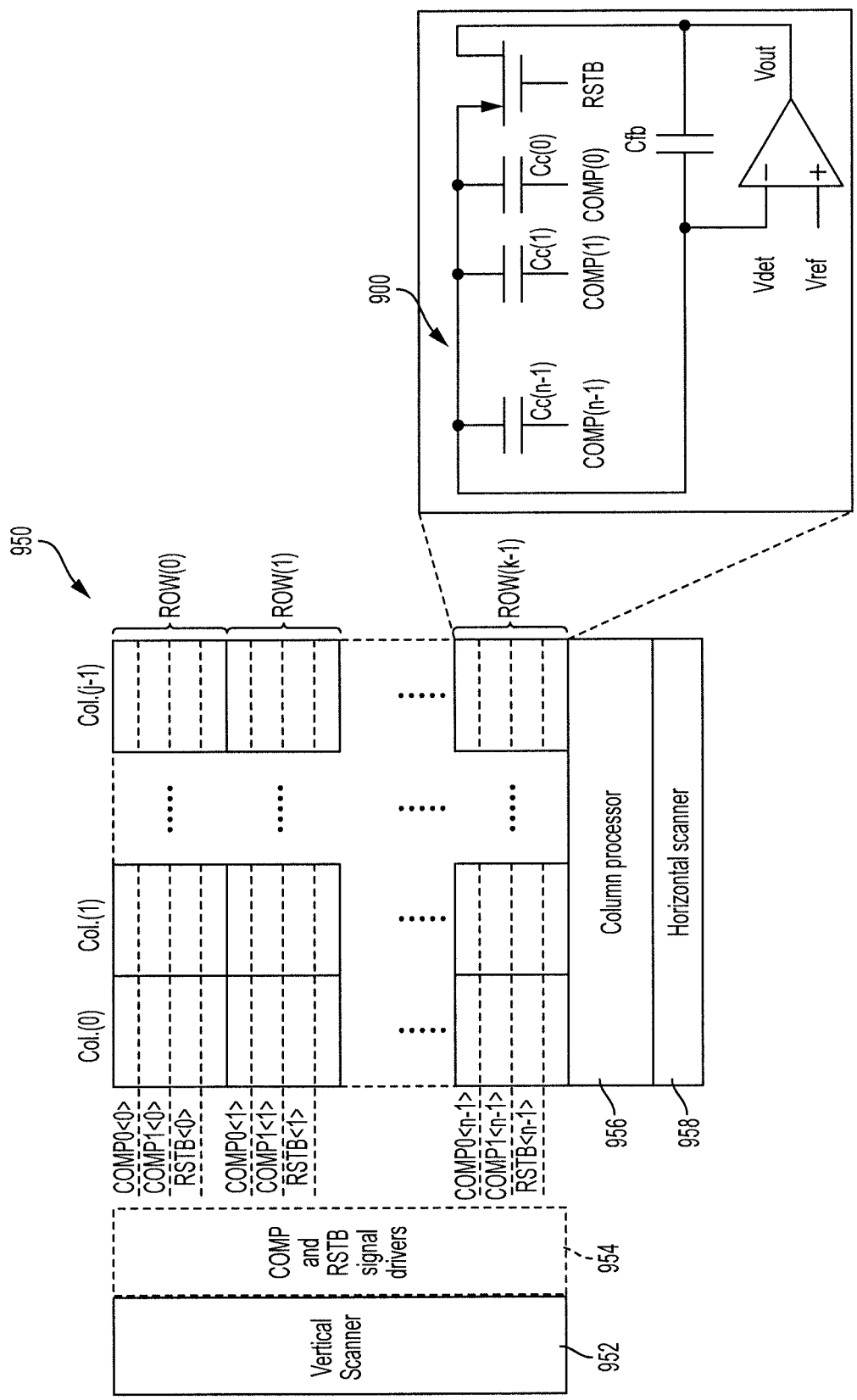
FIG. 9 is a schematic diagram of a pixel array for a CMOS image sensor, wherein each pixel of the pixel array includes a CTIA circuit according to an embodiment of the present invention.

FIG. 9 is a schematic diagram of a pixel array 950 for a CMOS image sensor, each pixel including a CTIA circuit 900 according to an embodiment of the present invention. There are k rows and j columns of pixels. The embodiment shown in FIG. 9 illustrates an example that utilizes two compensation signals per pixel (COMP(0) and COMP(1)). It can be appreciated that this can be extended to include n compensation signals as discussed above. The CTIA circuit 900 could be any of the CTIA circuits discussed above with respect to FIGS. 1A, 1B, and 3A-5B. Each pixel may contain additional devices or elements such as, but not limited to, a source follower driver with a row select switch for pixel readout.

For simplicity of illustration, only the compensation signals (COMPs) and the CTIA reset signals (RSTBs) are shown in FIG. 9. A pixel of the pixel array 950 may contain additional clock signals (such as row select), reference, bias, read bus and supply lines. The vertical scanner 952 generates the COMP and RSTB signals for each row as well as any other signals needed for pixel operation (for example row select signals which are not shown). These signals can be the same for each row (if a global shutter is utilized) or be different from row to row (if a rolling shutter is utilized). For example, in a rolling shutter image sensor the signal RSTB<i+1> is delayed with respect to RSTB<i> by one row read time, where i is any row between 0 and k−1.

The COMP signal drivers 954 condition the higher and lower voltage values of the compensation signals. One or both compensation voltage values may be adjustable (see e.g., FIGS. 6A-8B). The RSTB signal drivers 954 generate a reset signal with a relatively slow transition time (e.g., a slow RSTB rise time 109 for a CTIA using a PMOS reset switch 106 or a RST fall time 509 for a CTIA using an NMOS reset switch 506).

The reset and compensation signals are typically routed across the pixel array 950 using clock routing lines made of a conductive material such as metal. These clock routing lines have certain resistance and capacitance per unit length, which leads to an RC propagation delay. As set forth above with respect to FIG. 1B, one of the advantages of the invention is that the RC propagation delays of the reset and compensation signals do not cause a substantial variation in the voltage error at the CTIA output voltage port (Vout) of each pixel, and thus do not cause a substantial amount of variation (or gradient) across the pixel array 950.

In one embodiment, the pixel array 950 may be utilized in a hybrid implementation such that photodiodes are implemented on a detector wafer that is separate from the CMOS readout circuit wafer containing the CTIA circuits. Each photodiode is connected (via indium interconnects or otherwise) to the inverting input port (Vdet) of the amplifier of a corresponding CTIA circuit.

In the hybrid implementation, the invention advantageously allows the functionality of each CTIA circuit 900 to be tested by varying the amount of charge compensation. As explained earlier, this can be accomplished by toggling some but not all compensation signals and/or by adjusting the high and/or low compensation voltage level by means of a DAC. This advantageously allows the CMOS readout circuit wafer to be tested for functionality and yield prior to connection or hybridization with a detector wafer (e.g., an infrared detector wafer).

As set forth above, the invention advantageously allows the reset transistor to be minimum-sized in order to substantially reduce or minimize the amount of charge deposited at the inverting input port of the amplifier. The invention advantageously allows the reset signals to have a slow transition time which enhances uniformity across the pixel array, and also reduces the amount of charge deposited by the reset switch at the inverting input port. In addition, the compensation capacitor (preferably metal-oxide-metal capacitor) can be implemented to provide less compensation charge than the channel charge of a minimum-sized MOS reset transistor. Notably, the compensation capacitor can have a low capacitance value (for example, less than 2 femtofarads) and take a small layout area. The metal-oxide-metal capacitors can be formed by running compensation signal metal lines in proximity to a metal layer electrically connected to the inverting input port of the amplifier.

A unique advantage of the invention is that a plurality of compensation capacitors can be provided, each being either toggled or in a static state, thereby allowing control of and adjustability in the amount of charge compensation. Alternatively, or in addition, one or more DACs can be utilized to adjust one or more compensation voltage values of the toggling compensation signals in order to allow control of and variation in the amount of charge compensation. In addition, the invention provides a simple method of injecting a signal at the inverting input port of the CTIA amplifier, which can be beneficial for screening of defective pixels and testing of the CTIA circuits before hybridization to a detector layer.

The invention described above can be implemented for high-gain CTIA pixels (e.g., with feedback capacitance of 2 fF or less). The invention can be further utilized in low light level image sensors, sensors for adaptive optics, Time Delay Integration (TDI) scanners, and in image sensors for X-ray spectroscopy such as for SMART-X (Square Meter, Arcsecond Resolution X-ray Telescope).

Exemplary implementations of the disclosure have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such implementations that reasonably fall within the scope of the advancement to the art hereby contributed, and that that scope shall not be restricted, except in light of the appended claims and their equivalents.

The invention claimed is:

1. A capacitive trans-impedance amplifier circuit with charge injection compensation, comprising:
   an amplifier having at least an inverting input port and an output port;
   a feedback capacitor connected between the inverting input port of the amplifier and the output port of the amplifier;
   a reset switch, implemented as a MOS transistor having a gate terminal, a source terminal and a drain terminal, the source terminal and the drain terminal being connected between the inverting input port and the output port of the amplifier, and the gate terminal being controlled by a reset signal, wherein the reset switch is configured to be in a closed or active state for establishing a conductive path between the inverting input port of the amplifier and the output port of the amplifier during a reset phase, and configured to be in an open or inactive state during an integration phase;
   a photodiode directly connected to the inverting input port of the amplifier; and
   one or more compensation capacitors that are configured to provide a total compensation charge that has an opposite polarity of a charge injected by the reset switch at the inverting input port, wherein each compensation capacitor is not implemented as a gate oxide or a MOS capacitor, and each compensation capacitor having:
      a first port connected to a compensation signal that is a static signal or a toggling compensation signal that toggles between a first compensation voltage value and a second compensation voltage value, and
      a second port connected to the inverting input port of the amplifier.

2. The capacitive trans-impedance amplifier circuit of claim 1, wherein
   the reset switch is a PMOS transistor,
   the reset signal has a first voltage value during the reset phase, and a second voltage value greater than the first voltage value during the integration phase,
   the toggling compensation signal of each compensation capacitor is equal to the first compensation voltage value during the reset phase and transitions to the second compensation voltage value a fixed delay after a start of the integration phase, and
   the first compensation voltage value is greater than the second compensation voltage value.

3. The capacitive trans-impedance amplifier circuit of claim 1, wherein
   the reset switch is an NMOS transistor,
   the reset signal has a first voltage value during the reset phase, and a second voltage value less than the first voltage value during the integration phase,
   the toggling compensation signal of each compensation capacitor is equal to the first compensation voltage value during the reset phase and transitions to the second compensation voltage value a fixed delay after a start of the integration phase, and
   the second compensation voltage value is greater than the first compensation voltage value.

4. The capacitive trans-impedance amplifier circuit of claim 1, wherein at least one of the one or more compensation capacitors is a metal-oxide-metal capacitor including routing metals separated by an oxide material, and having at least one of a lateral finger structure or a vertical structure with two metal layers separated by an oxide layer.

5. The capacitive trans-impedance amplifier circuit of claim 1, wherein the second port of each compensation capacitor is directly connected to the inverting input port of the amplifier.

6. The capacitive trans-impedance amplifier circuit of claim 1, wherein at least one of the one or more compensation capacitors is implemented as a metal-oxide-poly capacitor that includes an oxide layer that is used as an isolation layer between a routing metal and a polysilicon layer.

7. The capacitive trans-impedance amplifier circuit of claim 1, wherein the photodiode is biased to generate a photocurrent upon receiving photons.

8. The capacitive trans-impedance amplifier circuit of claim 1, wherein a lower voltage value of the first compensation voltage value or the second compensation voltage value is substantially equal to ground.

9. The capacitive trans-impedance amplifier circuit of claim 1, wherein a greater voltage value of the first compensation voltage value or the second compensation voltage value is substantially equal to a voltage value of a voltage supply of the capacitive trans-impedance amplifier circuit.

10. The capacitive trans-impedance amplifier circuit of claim 1, wherein the one or more compensation capacitors are a plurality of compensation capacitors configurable to collectively produce a compensation charge deposited at the inverting input port of the amplifier, the compensation charge being controlled by a number of the plurality of compensation capacitors that receive the toggling compensation signal, thereby allowing control of and variation in the compensation charge.

11. The capacitive trans-impedance amplifier circuit of claim 1, wherein at least one of the first compensation voltage value or the second compensation voltage value is generated by one or more digital-to-analog converters (DACs), and
the one or more DACs has an input port configured to receive a digital signal capable of having a plurality of combinations of bit values for allowing control of and variation in a compensation charge deposited at the inverting input port of the amplifier.

12. The capacitive trans-impedance amplifier circuit of claim 11, wherein at least one of the one or more DACs controls only one of the first compensation voltage value or the second compensation voltage value, and the other compensation voltage value is substantially equal to ground or a voltage value of a voltage supply of the capacitive trans-impedance amplifier circuit.

13. The capacitive trans-impedance amplifier circuit of claim 1, wherein
the toggling compensation signal of at least one of the one or more compensation capacitors is generated using a first DAC configured to output the first compensation voltage value and a second DAC configured to output the second compensation voltage value, and
a compensation control signal having substantially same timing as the toggling compensation signal and that controls switching between the output of the first DAC and the output of the second DAC, such that the toggling compensation signal is equal to the first compensation voltage value generated by the first DAC during the reset phase and transitions or switches to the second compensation voltage value generated by the second DAC a fixed delay after a start of the integration phase.

14. The capacitive trans-impedance amplifier circuit of claim 1, wherein the one or more compensation capacitors are a plurality of binary-scaled compensation capacitors.

15. The capacitive trans-impedance amplifier circuit of claim 1, wherein a transition time of the reset signal from the reset phase to the integration phase is such that the charge injected by the reset switch at the inverting input port decreases.

16. A pixel array for a CMOS image sensor, the pixel array having a plurality of pixels arranged in a plurality of rows and a plurality of columns, each pixel including a capacitive trans-impedance amplifier circuit, each capacitive trans-impedance amplifier circuit comprising:
an amplifier having at least an inverting input port and an output port;
a feedback capacitor connected between the inverting input port of the amplifier and the output port of the amplifier;
a reset switch, implemented as a MOS transistor having a gate terminal, a source terminal and a drain terminal, the source terminal and the drain terminal being connected between the inverting input port and the output port of the amplifier, and the gate terminal being controlled by a reset signal, wherein the reset switch is configured to be in a closed or active state for establishing a conductive path between the inverting input port of the amplifier and the output port of the amplifier during a reset phase, and configured to be in an open or inactive state during an integration phase;
a photodiode directly connected to the inverting input port of the amplifier; and
one or more compensation capacitors that are configured to provide a total compensation charge that has an opposite polarity of a charge injected by the reset switch at the inverting input port, each compensation capacitor is not implemented as a gate oxide or a MOS capacitor, and each compensation capacitor having:
a first port connected to a compensation signal that is a static signal or a toggling compensation signal that toggles between a first compensation voltage value and a second compensation voltage value, and
a second port connected to the inverting input port of the amplifier.

17. The pixel array of claim 16, wherein the one or more compensation capacitors are a plurality of compensation capacitors,
each toggling compensation signal of one of the plurality of compensation capacitors has substantially same timing as toggling compensation signals of other compensation capacitors of the plurality of compensation capacitors, and
at least two or more of the plurality of compensation capacitors are binary scaled.

18. The pixel array of claim 16, wherein the photodiode is implemented on a detector wafer and biased to generate a photocurrent upon receiving photons.

19. A capacitive trans-impedance amplifier circuit with charge injection compensation, comprising:
an amplifier having at least an inverting input port and an output port;
a feedback capacitor connected between the inverting input port of the amplifier and the output port of the amplifier;
a reset switch, implemented as a MOS transistor having a gate terminal, a source terminal and a drain terminal, the source terminal and the drain terminal being connected between the inverting input port and the output port of the amplifier, and the gate terminal being controlled by a reset signal, wherein the reset switch is configured to be in a closed or active state for establishing a conductive path between the inverting input port of the amplifier and the output port of the amplifier during a reset phase, and configured to be in an open or inactive state during an integration phase; and
two or more compensation capacitors, wherein at least one of the two or more compensation capacitors compensation capacitor is a metal-oxide-metal capacitor including routing metals separated by an oxide material, and having at least one of a lateral finger structure or a vertical structure with two metal layers separated by an oxide layer, and each compensation capacitor having:
a first port connected to a compensation signal that is electrically separate from any other compensation signal connected to a first port of any other compensation capacitor, the compensation signal being a static signal or a toggling compensation signal that toggles between a first compensation voltage value and a second compensation voltage value, and
a second port connected to the inverting input port of the amplifier.

20. The capacitive trans-impedance amplifier circuit of claim 19, wherein each toggling compensation signal of the two or more capacitors has substantially same timing as other compensation capacitors of the two or more capacitors.

* * * * *